(12) United States Patent
Kula et al.

(10) Patent No.: US 6,954,342 B2
(45) Date of Patent: Oct. 11, 2005

(54) UNDERLAYER FOR HIGH AMPLITUDE SPIN VALVE SENSORS

(75) Inventors: Witold Kula, Cupertino, CA (US); Alexander Zeltser, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 433 days.

(21) Appl. No.: 09/846,707

(22) Filed: Apr. 30, 2001

(65) Prior Publication Data

US 2002/0159205 A1 Oct. 31, 2002

(51) Int. Cl.⁷ ............................................... G11B 5/33
(52) U.S. Cl. ................................................. 360/324.11
(58) Field of Search ............................ 360/324, 324.11, 360/324.12

(56) References Cited

U.S. PATENT DOCUMENTS

| | | | | |
|---|---|---|---|---|
| 5,648,885 A | 7/1997 | Nishioka et al. | ............ | 360/113 |
| 5,793,207 A | 8/1998 | Gill | ............ | 324/252 |
| 5,793,279 A | 8/1998 | Nepela | ............ | 338/32 |
| 5,828,531 A | 10/1998 | Gill | ............ | 360/113 |
| 5,828,598 A | 10/1998 | Chen et al. | ............ | 365/158 |
| 5,869,963 A | 2/1999 | Saito et al. | ............ | 324/252 |
| 5,880,913 A | 3/1999 | Gill | ............ | 360/113 |
| 5,898,612 A | 4/1999 | Chen et al. | ............ | 365/158 |
| 5,955,211 A | 9/1999 | Maeda et al. | ............ | 428/692 |
| 5,968,676 A | 10/1999 | Araki et al. | ............ | 428/692 |
| 5,993,566 A | 11/1999 | Lin | ............ | 148/108 |
| 6,185,081 B1 * | 2/2001 | Simion et al. | ............ | 360/327.3 |
| 6,222,707 B1 * | 4/2001 | Huai et al. | ............ | 360/324.1 |
| 6,433,972 B1 * | 8/2002 | Mao et al. | ............ | 360/324.11 |
| 6,490,140 B1 * | 12/2002 | Mao et al. | ............ | 360/324.11 |
| 6,498,707 B1 * | 12/2002 | Gao et al. | ............ | 360/324.11 |
| 6,507,457 B2 * | 1/2003 | He et al. | ............ | 360/126 |

OTHER PUBLICATIONS

IBM TDB, "Laminated Seed Layers for Plated Thin Film Heads and Structures", vol. 35, issue 1B, pp. 457–459, Jun. 1, 1992.*

* cited by examiner

Primary Examiner—Brian E. Miller
(74) Attorney, Agent, or Firm—Zilka-Kotab, PC

(57) ABSTRACT

A spin valve sensor system and a method for fabricating the same are provided. Such spin valve sensor includes a pinned layer having a pinned layer magnetization. Also included is a free layer disposed adjacent the pinned layer. The free layer has a free layer magnetization perpendicular to the pinned layer magnetization in the absence of an external field. A pinning layer is disposed adjacent the pinned layer for fixing the pinned layer magnetization. Further included is an underlayer disposed adjacent the pinning layer. Such underlayer comprises NiFeX. Disposed adjacent the underlayer and the pinning layer is an upper layer. The upper layer comprises a material selected from the group consisting of NiFe and CoFe for increasing a GMR ratio associated with the SV sensor.

16 Claims, 8 Drawing Sheets

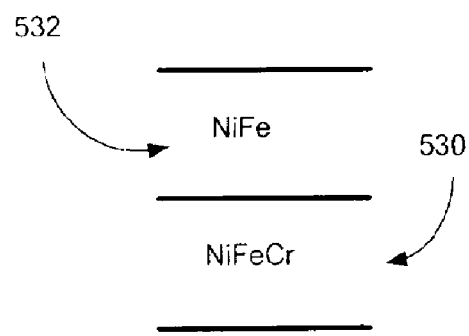 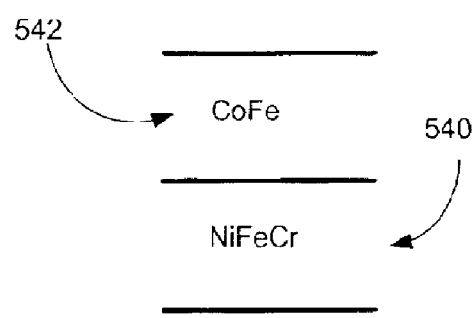
FIG. 5B-1     FIG. 5B-2

US 6,954,342 B2

UNDERLAYER FOR HIGH AMPLITUDE SPIN VALVE SENSORS

FIELD OF THE INVENTION

The present invention relates to magnetoresistive read sensors for reading signals recorded in a magnetic medium, and more particularly, this invention relates to tailoring an underlayer of a spin valve magnetoresistive read sensor for improving operating characteristics.

BACKGROUND OF THE INVENTION

Computer systems generally utilize auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive read sensors, commonly referred to as MR heads, are the prevailing read sensors because of their capability to read data from a surface of a disk at greater linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization of the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and non-magnetic layers and within the magnetic layers.

GMR sensors using only two layers of ferromagnetic material separated by a layer of non-magnetic electrically conductive material are generally referred to as spin valve (SV) sensors manifesting the GMR effect (SV effect). In a spin valve sensor, one of the ferromagnetic layers, referred to as the pinned layer, has its magnetization typically pinned by exchange coupling with an antiferromagnetic (e.g., NiO, FeMn, PtMn) layer. The magnetization of the other ferromagnetic layer, referred to as the free layer, however, is not fixed and is free to rotate in response to the field from the recorded magnetic medium (the signal field). In spin valve sensors, the spin valve effect varies as the cosine of the angle between the magnetization of the pinned layer and the magnetization of the free layer. Recorded data can be read from a magnetic medium because the external magnetic field from the recorded magnetic medium causes a change in the direction of magnetization in the free layer, which in turn causes a change in resistance of the spin valve sensor and a corresponding change in the sensed current or voltage. It should be noted that the AMR effect is also present in the spin valve sensor free layer.

FIG. 1 shows a typical spin valve sensor 100 (not drawn to scale) comprising end regions 104 and 106 separated by a central region 102. The central region 102 has defined edges and the end regions are contiguous with and abut the edges of the central region. A free layer (free ferromagnetic layer) 110 is separated from a pinned layer (pinned ferromagnetic layer) 120 by a non-magnetic, electrically-conducting spacer 115. The magnetization of the pinned layer 120 is fixed through exchange coupling with an antiferromagnetic (AFM) 125. An underlayer 126 is positioned below the AFM layer 125.

The underlayer 126, or seed layer, is any layer deposited to modify the crystallographic texture or grain size of the subsequent layers, and may not be needed depending on the substrate. A variety of oxide and/or metal materials have been employed to construct underlayer 126 for improving the properties of spin valve sensors. Often, the underlayer 126 may be formed of tantalum (Ta), zirconium (Zr), hafnium (Hf), or yttrium (Y). Ideally, such layer comprises NiFeCr in order to further improve operational characteristics. In particular, NiFeCr underlayer has been very successful in improving operational characteristics such as ΔR/R which will be set forth in greater detail hereinafter.

Free layer 110, spacer 115, pinned layer 120, the AFM layer 125, and the underlayer 126 are all formed in the central region 102. Hard bias layers 130 and 135 formed in the end regions 104 and 106, respectively, provide longitudinal bias for the free layer 110. Leads 140 and 145 formed over hard bias layers 130 and 135, respectively, provide electrical connections for the flow of the sensing current $I_s$ from a current source 160 to the MR sensor 100. Sensor 170 is connected to leads 140 and 145 senses the change in the resistance due to changes induced in the free layer 110 by the external magnetic field (e.g., field generated by a data bit stored on a disk). IBM's U.S. Pat. No. 5,206,590 granted to Dieny et al. and incorporated herein by reference, discloses an MR sensor operating on the basis of the spin valve effect.

Another type of spin valve sensor is an anti-parallel (AP)-pinned spin valve sensor. FIG. 2A shows an exemplary AP-Pinned spin valve sensor 200 (not drawn to scale). Spin valve sensor 200 has end regions 202 and 204 separated from each other by a central region 206. AP-pinned spin valve sensor 200 comprises a Ni-Fe free layer 225 separated from a laminated AP-pinned layer 210 by a copper spacer layer 220. The magnetization of the laminated AP-pinned layer 210 is fixed by an AFM layer 208, or pinning layer, which is made of NiO. Again, beneath the AFM layer 208 is an underlayer 209. The laminated AP-pinned layer 210 includes a first ferromagnetic layer 212 (PF1) of cobalt and a second ferromagnetic layer 216 (PF2) of cobalt separated from each other by a ruthenium (Ru) anti-parallel coupling layer 214. The AMF layer 208, AP-pinned layer 210, copper spacer 220, free layer 225 and a cap layer 230 are all formed sequentially in the central region 206. Hard bias layers 235 and 240, formed in end regions 202 and 204, provide longitudinal biasing for the free layer 225. Electrical leads 245 and 250 are also formed in end regions 202 and 204, respectively, to provide electrical current from a current source (not shown) to the spin valve sensor 200.

Various parameters of a spin valve sensor may be used to evaluate the performance thereof. A couple of examples of such parameters are the structure sheet resistance (R) and GMR ratio ($\Delta R/R$) The GMR ratio ($\Delta R/R$) is defined as $(R_{AP}-R_P)/R_P$, where $R_{AP}$ is the anti-parallel resistance and $R_P$ is the parallel resistance.

Numerous theoretical studies have attempted to explain the behavior of spin valve effects. However, there does not currently exist an explanation of the main factors controlling the magnitude of the sensor response, as characterized by $\Delta R/R$, as it relates to the required properties of the conductive spacers and ferromagnetic (FM) layers constituting such device. Experimental efforts have been largely based on trial and error, by investigating various combinations of FM layers and conductive spacer layers. None of the previous work has yielded quantitative guidelines for the maximization of $\Delta R/R$ for spin valve sensors by providing selection criteria for the layer compositions of the FM material and the conductive spacer.

What is known is that the GMR effect depends on the angle between the magnetizations of the free and pinned layers. More specifically, the GMR effect is proportional to the cosine of the angle $\beta$ between the magnetization vector of the pinned layer ($M_P$) and the magnetization vector of the free layer ($M_F$) (Note FIGS. 2B and 2C). In a spin valve sensor, the electron scattering and therefore the resistance is maximum when the magnetizations of the pinned and free layers are antiparallel, i.e., majority of the electrons are scattered as they try to cross the boundary between the MR layers. On the other hand, electron scattering and therefore the resistance is minimum when the magnetizations of the pinned and free layers are parallel; i.e., majority of electrons are not scattered as they try to cross the boundary between the MR layers.

In other words, there is a net change in resistance of a spin valve sensor between parallel and antiparallel magnetization orientations of the pinned and free layers. The GMR effect, i.e., the net change in resistance, exhibited by a typical prior art spin valve sensor is about 6% to 8%.

In prior art spin valve sensors, the AFM layer (125, 208 of FIGS. 1 and 2, respectively) has the antiferromagnetism thereof strongly affected by the underlayer (126, 209 of FIGS. 1 and 2, respectively). As a result, the magnetizations of the pinned and free layers are varied with the material of the underlayer. In particular, the AFM layer fails to operate perfectly due to the underlayer. For example, the use of conventional underlayer materials such as zirconium (Zr) is deficient in resistance due to corrosion. This phenomenon in turn causes the magnetizations of the pinned and free layers to be weak since the pinned layer is not fully fixed. As a result, it has been difficult to obtain optimum operation because the direction of magnetization of the pinned layer varies relative to the signal magnetic field.

There is therefore a need for an improved underlayer in a spin valve sensor that alters R and $\Delta R/R$ to improve overall performance of a spin valve sensor.

DISCLOSURE OF THE INVENTION

It is an object of the present invention to disclose an improved spin valve sensor that alters R and $\Delta R/R$ for overall improved performance.

It is another object of the present invention to disclose an improved spin valve sensor with a layer of NiFe and/or CoFe over an underlayer thereof.

It is still another object of the present invention to disclose a method of fabricating an improved spin valve sensor with a layer of NiFe and/or CoFe over an underlayer thereof.

These and other objects and advantages are attained in accordance with the principles of the present invention by disclosing a spin valve sensor system and a method for fabricating the same. Such spin valve sensor includes a pinned layer having a pinned layer magnetization. Also included is a free layer disposed adjacent the pinned layer. The free layer has a free layer magnetization perpendicular to the pinned layer magnetization in the absence of an external field. A pinning layer is disposed adjacent the pinned layer for fixing the pinned layer magnetization. Further included is an underlayer disposed adjacent the pinning layer. Such underlayer comprises NiFeX. Disposed adjacent the underlayer and the pinning layer is an upper layer. The upper layer comprises a material selected from the group consisting of NiFe and CoFe for increasing a GMR ratio associated with the spin valve sensor.

In one embodiment of the present invention, the upper layer may be deposited with a thickness of at least 4 A. Optionally, the upper layer may have a thickness of no more than 20 A. Still yet, the upper layer may be doped. To deposit the upper layer, physical vapor deposition (PVD) sputtering may be utilized.

In another embodiment of the present invention, the underlayer may include NiFeCr. As an option, the underlayer may include 40+/−5 Atomic % Cr. It should be noted that the spin valve sensor may take any form such as a top spin valve, a bottom spin valve, a dual spin valve, and/or an anti-parallel (AP)-pinned spin valve sensor.

In another aspect of the present invention, a method may be provided for fabricating the spin valve sensor. During such method for a bottom spin valve, an underlayer of NiFeX is deposited after which an upper layer is sputtered adjacent the underlayer. As set forth hereinabove, the upper layer comprises a material selected from the group consisting of NiFe and CoFe. Thereafter, a pinning layer (in addition to free and pinned layers) is disposed adjacent the upper layer.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIGS. 5B-1 and 2 show two exemplary embodiments of the use of an upper layer above the underlayer for improving the operational characteristics of the spin valve sensor.

BEST MODE FOR CARRYING OUT THE INVENTION

The following description is the best embodiment presently contemplated for carrying out the present invention.

This description is made for the purpose of illustrating the general principles of the present invention and is not meant to limit the inventive concepts claimed herein.

Figure 3:
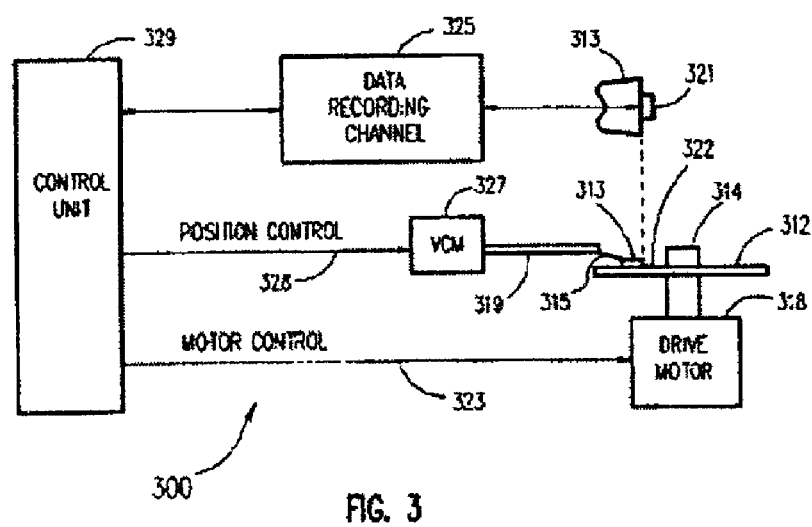
FIG. 3 is a perspective drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording media on each disk is in the form of an annular pattern of concentric data tracks (not shown) on disk 312.

At least one slider 313 is positioned on the disk 312, each slider 313 supporting one or more magnetic read/write heads 321 where the head 321 incorporates the MR sensor of the present invention. As the disks rotate, slider 313 is moved radially in and out over disk surface 322 so that heads 321 may access different portions of the disk where desired data are recorded. Each slider 313 is attached to an actuator arm 319 by way of a suspension 315. The suspension 315 provides a slight spring force which biases slider 313 against the disk surface 322. Each actuator arm 319 is attached to an actuator 327. The actuator 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a magnetic disk storage system of the present invention, and the accompanying illustration of FIG. 3 are for representation purposes only. It should be apparent that disk storage systems may contain a large number of disks and actuators, and each actuator may support a number of sliders.

Figure 4:
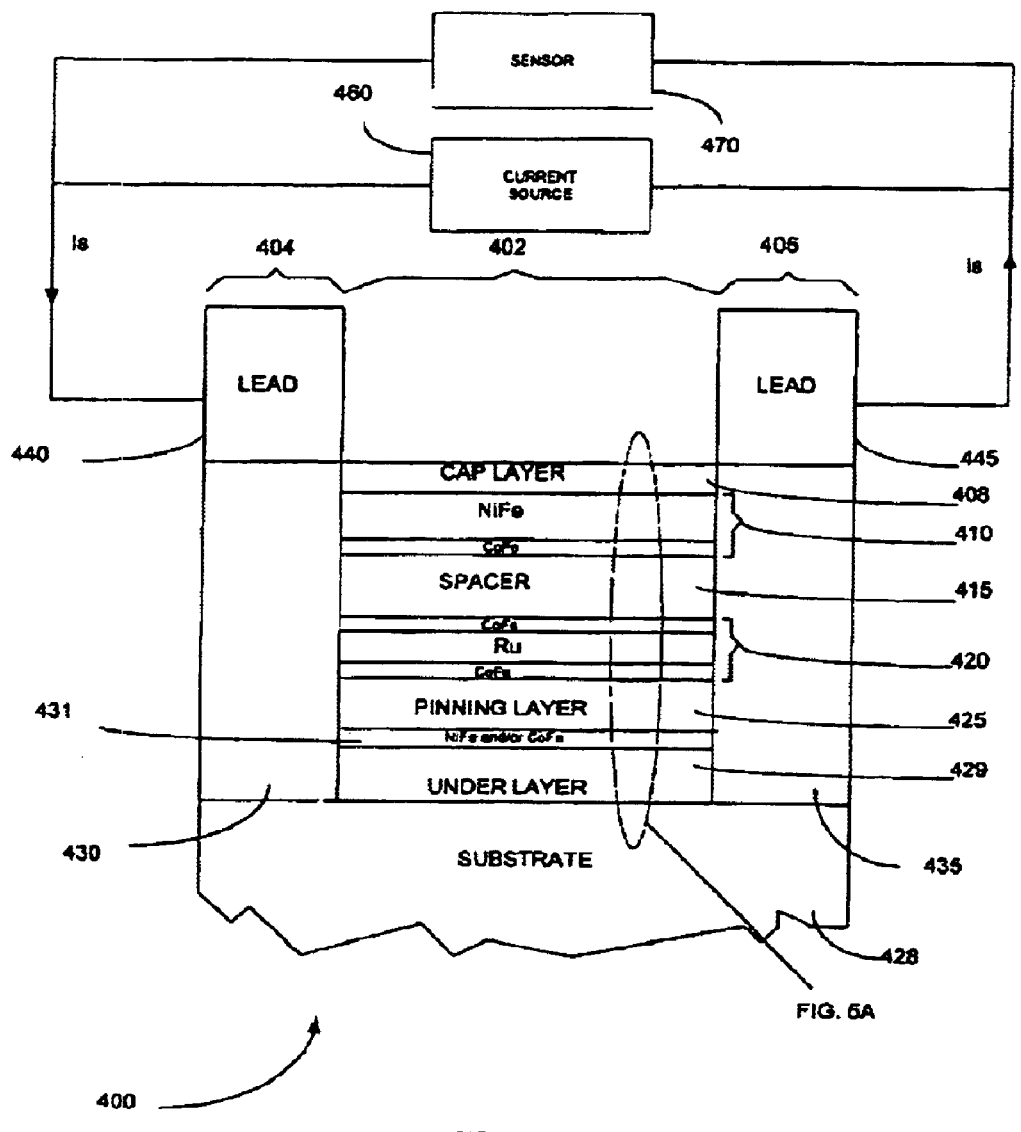
FIG. 4 is a schematic diagram of the cross-section of the preferred spin valve sensor of the present invention.

Now referring to FIG. 4, there is shown an air bearing surface (ABS) view of the spin valve sensor 400 (not drawn to scale) having the structure of Underlayer(including NiFeCr)/NiFe/PtMn/CoFe/Ru/CoFe/Spacer/CoFe/NiFe/Ta and manufactured, using a sputter deposition process, according to the preferred embodiment of the present invention. Spin valve sensor 400 comprises end regions 404 and 406 separated by a central region 402. A free layer (free ferromagnetic layer) 410, comprising a NiFe layer and a thin CoFe layer, is separated from a pinned layer (pinned ferromagnetic layer) 420, comprising a Ru layer and two thin CoFe layers, by a non-magnetic, electrically-conducting spacer layer 415. As an option, such electrically conducting spacer layer 415 may include $CuO_x$. The magnetization of the pinned layer 420 is fixed by an antiferromagnetic (AFM) layer 425. An underlayer 429, AFM layer 425, pinned layer 420, spacer layer 415, free layer 410, and a cap layer 408 are all formed in that order in the central region 402.

The underlayer 429 or seed layer is deposited to modify the crystallographic texture or grain size of the subsequent layers. In accordance with a preferred embodiment of the present invention, such underlayer 429 has an upper layer 431 thereon which comprises a material selected from the group consisting of NiFe, CoFe, or a combination thereof. More information regarding such improvement will be set forth in greater detail during reference to FIGS. 5–6.

Referring still to FIG. 4, the spin valve sensor 400 further comprises layers 430 and 435 formed in the end regions 404 and 406, respectively, for providing a longitudinal bias field to the free layer 410 to ensure a single magnetic domain state in the free layer 410. Layers 430 and 435, preferably made of hard magnetic material such as CoPtCr, are deposited and magnetically aligned at room temperature according to the well-known methods established in the prior art. Lead layers 440 and 445 are formed over hard bias layers 430 and 435 in the end regions 404 and 406, respectively, by the methods known in the prior art.

Leads 440 and 445 provide electrical connections for the flow of the sensing current $I_s$ from a current source 460 to the spin valve sensor 400. Sensor 470 is connected to leads 440 and 445 senses the change in the resistance due to changes induced in the free layer 410 by the external magnetic field (e.g., field generated by a data bit stored on a disk).

The above description of a spin valve sensor of the present invention, and the accompanying illustration of FIG. 4 are for representation purposes only. It should be apparent that spin valve sensors may contain differing layers of varying materials for accomplishing similar results. Moreover, the spin valve sensor may include a top spin valve, a bottom spin valve, a dual spin valve, and/or any other type of spin valve per the desires of the user.

Figure 5A:
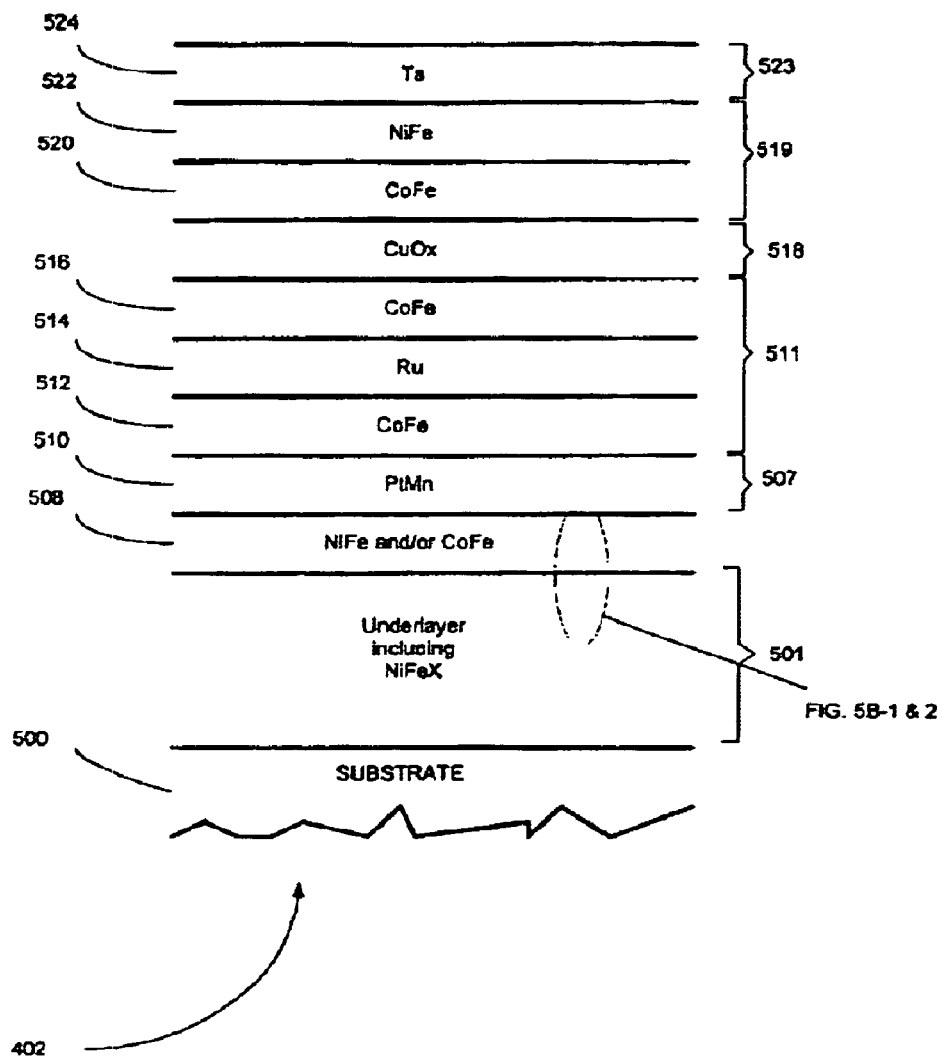
FIG. 5A is a schematic diagram of the cross-section of a thin film structure in accordance with one embodiment of the present invention.

Referring now to FIG. 5A, the sputter deposition process for fabrication of the central region 402 of FIG. 4 of spin valve sensor 400 is shown (not to scale) with deposition on a substrate 500 of suitable underlayer 501 materials such as NiFeX. It should be noted that the Ni and Fe of the NiFeX may be combined with any desired material, X. For example, the underlayer 501 may include NiFeCr. As an option, the underlayer 501 may include 40+/−5 Atomic % Cr.

An upper layer 508 is deposited above the underlayer 501 for improving the operational characteristics of the spin valve sensor. In one embodiment, the upper layer 508 may include NiFe, CoFe, or any combination thereof with any desired elements. For example, the upper layer 508 may be doped.

While such upper layer 508 may be deposited in any desired manner, physical vapor deposition (PVD) sputtering may be utilized in one embodiment. PVD sputtering is commonly used for depositing metal films and the like onto substrate surfaces. A planar target is typically positioned within a chamber, in spaced apart and symmetrical counter-facing relation with the substrate. The target is made of the material that is to be sputter deposited onto the substrate surface. Emission-inducing energy is applied to the active face of the target in the form, for example, of a plasma containing accelerated argon ions. In response to such bombardment, the active face of the target emits small particles composed of the target material. The emitted particles follow a generally linear trajectory from their point of emission on the target surface to a collision point on the counterfacing surface of the substrate. Physical adhesion mechanisms cause the target particles to bond to the surface of the substrate.

In one embodiment of the present invention, the upper layer 508 may be deposited with a thickness of at least 4 A. Optionally, the upper layer 508 may have a thickness of no more than 10 A after which benefits are abated. Further, the upper layer 508 may have a thickness of no more than 20A after which benefits are seriously abated.

Thereafter, an antiferromagnetic (AFM) pinning layer 507 is deposited. The preferred composition of the AFM layer is a PtMn composition 510. It should be noted that, in the present description, the notation "PtMn" (or any other combination of materials) refers to any desirable amount of either materials, i.e. Pt–Mn. A pinned layer 511 is subsequently deposited in direct contact and overlaying the pinning layer 507. The pinned layer 511 includes a CoFe layer 512 followed by a Ru layer 514 and another CoFe layer 516. Following the pinned layer 511, a spacer layer 518 is deposited such as $CuO_x$.

The above description of a spin valve sensor structure of the present invention, and the accompanying illustration of FIG. 5A are for representation purposes only. Such spin valve sensor structure is that which was used to produce the analysis data set forth hereinbelow. Such data shows improvements associated with applying the principles of the upper layer 508 over the underlayer 501 of the present invention. It should be noted, however, that other spin valve sensor structures including differing layers of varying materials may be employed while still achieving improvements unique to the additional layer covering the underlayer 501.

Figure 1:
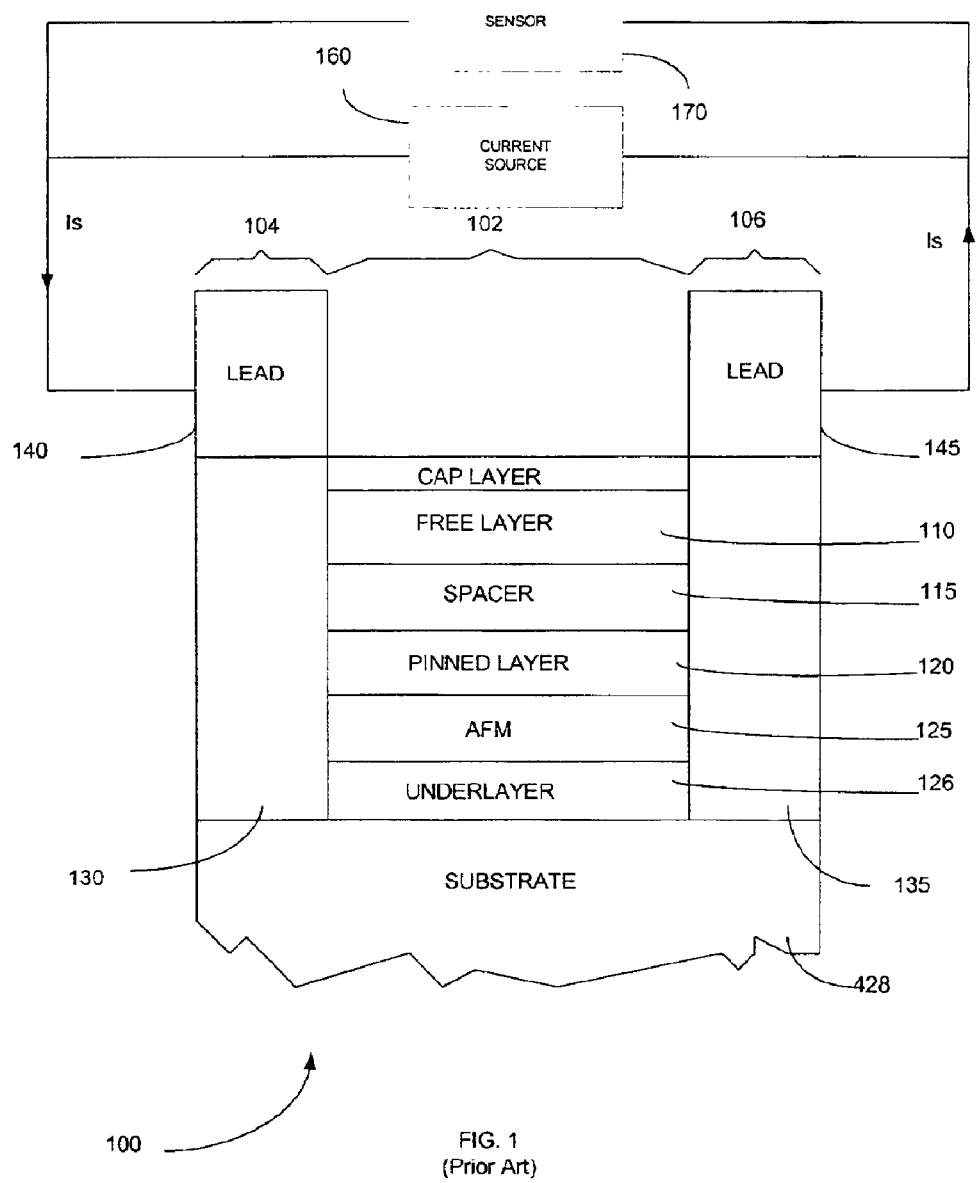
FIG. 1 is a schematic diagram of the cross-section of a prior art spin valve sensor.
Figure 2A:
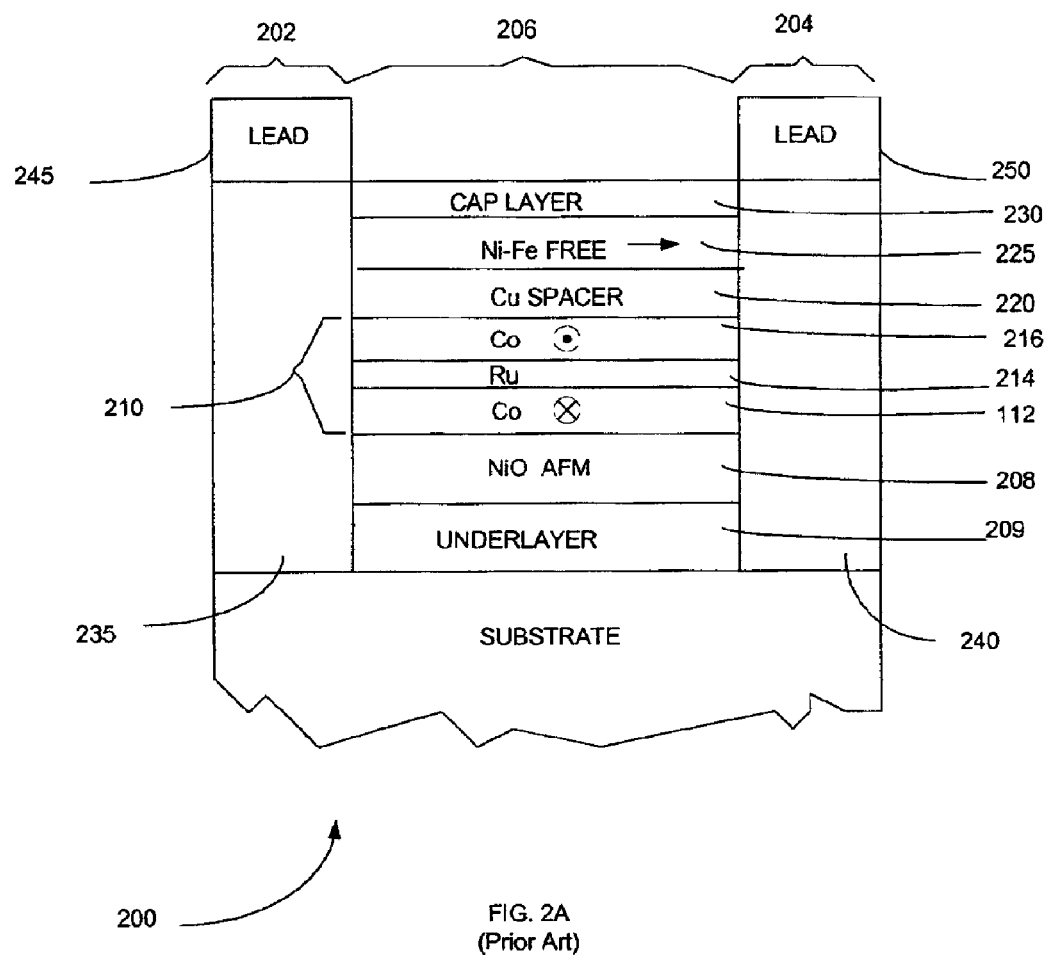
FIG. 2A shows an AP-Pinned spin valve sensor in accordance with the prior art.
Figure 2B:
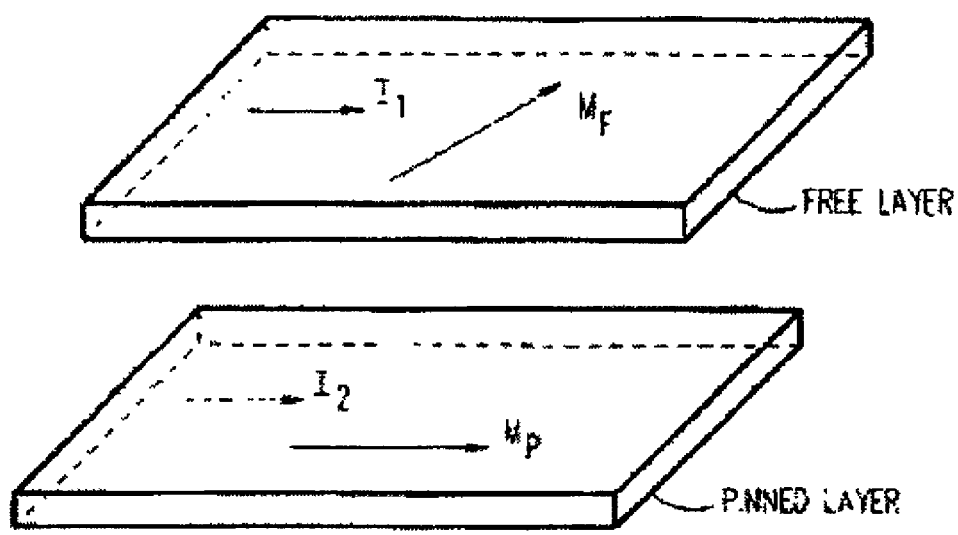
FIGS. 2B and 2C illustrate a perspective of the free and pinned layers, and a diagram of the magnetization vectors, respectively, of a prior art spin valve sensor.
Figure 2C:

FIGS. 5B-1 and 2 show two exemplary embodiments of the use of the upper layer 508 above the underlayer 501 (not drawn to scale) for improving the operational characteristics of the spin valve sensor. It should be noted that such exemplary embodiments are for illustrative purposes only, and that any desired combination of NiFe and CoFe may be utilized with any NiFeX structure. FIG. 5B-1 illustrates a first embodiment where NiFeCr 530 is covered with NiFe 532. FIG. 5B-2 illustrates a second embodiment where NiFeCr 540 is covered with CoFe 542.

It has been shown that an application of 4 A or more NiFe or CoFe upper layer 508 on top of an underlayer 501 including NiFeCr greatly improves the GMR ratio ($\Delta R/R$). GMR ratios have been improved from 9.0% to 12.8% in the device-quality bottom PtMn AP-pinned spin valve structures of next generation recording heads. An example of such next generation recording heads is the IBM GMR 5.5 series record head. As is well known in the art, a high GMR ratio is essential in improving the performance of the spin valve sensors.

Figure 6:
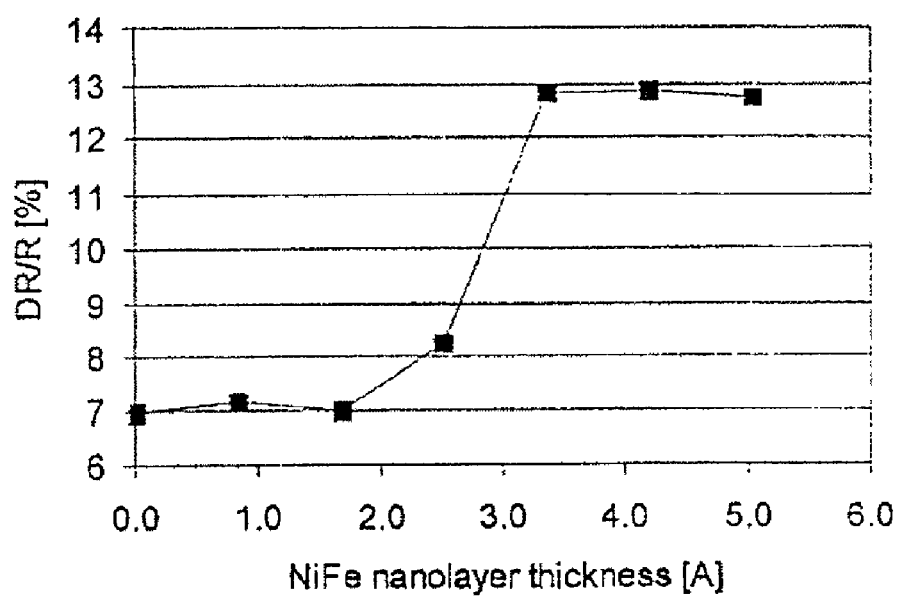
FIG. 6 shows the dependence of the spin valve GMR ratio on a thickness of a NiFe upper layer inserted on top of a NiFeCr underlayer.

FIG. 6 shows the dependence of the spin valve GMR ratio on the thickness of NiFe upper layer 508 inserted on top of the underlayer 501. An increase in $\Delta R/R$ from 7.0% to 12.8% is observed with just a few Angstroms thick NiFe upper layer 508. The same Characteristics are obtained with a CoFe upper layer 508. It is also expected that the use of other upper layers 508 with similar microstructure (e.g., appropriately doped NiFe or CoFe) would lead to the same effect.

In addition to inducing the increase in $\Delta R/R$, insertion of the upper layer 508 lowers the structure sheet resistance R, and increases the pinning field. It may be found that the addition of the upper layer 508 may have no effect on the interlayer coupling field $H_f$.

It should be noted that a 10 A thick upper layer 508 inside the structure set forth hereinabove does not have a measurable magnetic moment associated therewith. Application of an upper layer 508 thicker than 10 A works as well, but it does not lead to further $\Delta R/R$ improvement. In fact, it eventually leads to increased current shunting and buildup of magnetic moment in the underlayer 501. This can be undesirable in some applications. Such detrimental effects could likely be prevented by using a non-magnetic, high-resistivity (e.g., appropriately doped NiFe or CoFe) upper layer 508.

As will be apparent to one skilled in the art, the fabrication methods of the preferred embodiment and the alternative embodiments described herein may be used to fabricate spin valve sensors having any other layered structure, i.e. underlayer/pinned layer/spacer/free layer. Further, it should be noted that the various principles of the present invention may be applicable in a very broad range of spin valve sensor devices.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A spin valve (SV) sensor, comprising:
   a pinned layer having a pinned layer magnetization;
   a free layer disposed towards the pinned layer, the free layer having a free layer magnetization perpendicular to the pinned layer magnetization in the absence of an external field;
   a spacer layer disposed between the free layer and the pinned layer;
   a pinning layer disposed towards the pinned layer for fixing the pinned layer magnetization;
   an underlayer disposed towards the pinning layer, the underlayer comprising NiFeX; and
   an upper layer disposed adjacent the underlayer and the pinning layer, the upper layer comprising at least one material selected from the group consisting of NiFe and CoFe for increasing a GMR ratio associated with the SV sensor;
   wherein the sensor provides an increase of $\Delta R/R$ of at least 5% when compared to an otherwise identical sensor not having the upper layer;
   wherein the upper layer is doped with a material other than NiFe or CoFe for decreasing an electrical conductivity of the upper layer.

2. The spin valve sensor as recited in claim 1, wherein the upper layer has a thickness of at least 4 A.

3. The spin valve sensor as recited in claim 1, wherein the upper layer has a thickness of less than 5 A.

4. The spin valve sensor as recited in claim 1, wherein the underlayer comprises NiFeCr.

5. The spin valve sensor as recited in claim 1, wherein the SV sensor is a component of a disk drive system.

6. The spin valve sensor as recited in claim 1, wherein the underlayer includes 40+/−5 Atomic % Cr.

7. The spin valve sensor as recited in claim 1, wherein the pinned layer comprises a Ru layer, a first CoFe layer disposed adjacent a first side of the Ru layer and a second CoFe layer disposed adjacent a second side of the Ru layer.

8. The spin valve sensor as recited in claim 1, wherein the underlayer comprises NiFeX where X is not Cr.

9. The spin valve sensor as recited in claim 1, wherein the upper layer is non-magnetic.

10. A spin valve (SV) sensor, comprising:
    a pinned layer having a pinned layer magnetization;
    a free layer disposed towards the pinned layer, the free layer having a free layer magnetization perpendicular to the pinned layer magnetization in the absence of an external field;
    a spacer layer disposed between the free layer and the pinned layer;
    a pinning layer disposed towards the pinned layer for fixing the pinned layer magnetization;
    an underlayer disposed towards the pinning layer, the underlayer comprising NiFeX; and
    an upper layer disposed adjacent the underlayer and the pinning layer, the upper layer comprising at least one material selected from the group consisting of NiFe and CoFe for increasing a GMR ratio associated with the SV sensor;
    wherein the sensor provides an increase of $\Delta R/R$ of at least 5% when compared to an otherwise identical sensor not having the upper layer;
    wherein the upper layer includes both NiFe and CoFe.

11. A method of fabricating a spin valve (SV) sensor comprising:
    depositing an underlayer comprising NiFeX, where X is not Cr;
    depositing an upper layer adjacent the underlayer, the upper layer comprising at least one material selected from the group consisting of NiFe and CoFe for increasing a GMR ratio associated with the SV sensor;
    depositing a pinning layer towards the upper layer;
    depositing a pinned layer towards the pinning layer; the pinned layer having a pinned layer magnetization;
    depositing a spacer layer towards the pinned layer; and
    depositing a free layer towards the spacer layer, the free layer having a free layer magnetization perpendicular to the pinned layer magnetization in the absence of an external field;
    wherein the upper layer is doped for at least one of reducing an electrical conductivity of the upper layer and reducing magnetic properties of the upper layer.

12. The method as recited in claim 11, wherein the upper layer has a thickness of at least 4 A.

13. The method as recited in claim 12, wherein the upper layer has a thickness of no more than 20 A.

14. A method of fabricating a spin valve (SV) sensor comprising:
    depositing an underlayer comprising NiFeX, where X is not Cr;
    depositing an upper layer adjacent the underlayer, the upper layer comprising at least one material selected from the group consisting of NiFe and CoFe for increasing a GMR ratio associated with the SV sensor;
    depositing a pinning layer towards the upper layer;
    depositing a pinned layer towards the pinning layer, the pinned layer having a pinned layer magnetization;
    depositing a spacer layer towards the pinned layer; and
    depositing a free layer towards the spacer layer, the free layer having a free layer magnetization perpendicular to the pinned layer magnetization in the absence of an external field;
    wherein the upper layer includes both NiFe and CoFe.

15. A spin valve (SV) sensor comprising:
    a pinned layer having a pinned layer magnetization;
    a free layer disposed towards the pinned layer, the free layer having a free layer magnetization perpendicular to the pinned layer magnetization in the absence of an external field;
    a pinning layer disposed towards the pinned layer for fixing the pinned layer magnetization;
    an underlayer disposed towards the pinning layer, the underlayer comprising NiFeCr; and
    an upper layer disposed adjacent the underlayer and the pinning layer, the upper layer comprising a material selected from the group consisting of NiFe and CoFe for increasing a GMR ratio associated with the SV sensor;
    wherein the upper layer is doped with a material other than NiFe or CoFe for reducing at least one of an electrical conductivity of the upper layer and magnetic properties of the upper layer.

16. A spin valve (SV) sensor comprising:
    a single pinned layer having a pinned layer magnetization, the pinned layer comprising a Ru layer with a first CoFe layer disposed adjacent a first side of the Ru layer and a second CoFe layer disposed adjacent a second side of the Ru layer;
    a free layer disposed towards the pinned layer, the free layer having a free layer magnetization perpendicular to the pinned layer magnetization in the absence of an external field, the free layer comprising a NiFe layer with a third CoFe layer disposed adjacent thereto;
    a spacer layer disposed between the free layer and the pinned layer;
    a pinning layer disposed towards the pinned layer for fixing the pinned layer magnetization, the pinning layer comprising PtMn;
    an underlayer disposed towards the pinning layer, the underlayer comprising NiFeCr, and
    an upper layer disposed towards the underlayer and the pinning layer, the upper layer comprising a material selected from the group consisting of NiFe and CoFe for increasing a GMR ratio associated with the SV sensor
    wherein the upper layer has a thickness less than 20 A;
    wherein the upper layer is doped with a material other than NiFe or CoFe for reducing at least one of an electrical conductivity of the upper layer and magnetic properties of the upper layer;
    wherein the sensor provides an increase of $\Delta R/R$ of at least 5% when compared to an otherwise identical sensor not having the upper layer.

* * * * *